United States Patent
Zhang et al.

(10) Patent No.: US 10,295,679 B2
(45) Date of Patent: May 21, 2019

(54) SEMICONDUCTOR DETECTOR

(71) Applicant: NUCTECH COMPANY LIMITED, Beijing (CN)

(72) Inventors: Lan Zhang, Beijing (CN); Yingshuai Du, Beijing (CN); Bo Li, Beijing (CN); Zonggui Wu, Beijing (CN); Jun Li, Beijing (CN); Xuepeng Cao, Beijing (CN); Haifan Hu, Beijing (CN); Jianping Gu, Beijing (CN); Guangming Xu, Beijing (CN); Bicheng Liu, Beijing (CN)

(73) Assignee: NUCTECH COMPANY LIMITED, Beijing (CN)

( * ) Notice: Subject to any disclaimer, the term of this patent is extended or adjusted under 35 U.S.C. 154(b) by 0 days.

(21) Appl. No.: 15/609,476

(22) Filed: May 31, 2017

(65) Prior Publication Data
US 2018/0059262 A1   Mar. 1, 2018

(30) Foreign Application Priority Data
Aug. 31, 2016   (CN) .......................... 2016 1 0798761

(51) Int. Cl.
*G01T 1/24*   (2006.01)
*H01L 31/0224*   (2006.01)
*H01L 31/032*   (2006.01)

(52) U.S. Cl.
CPC ............. *G01T 1/24* (2013.01); *G01T 1/241* (2013.01); *H01L 31/022408* (2013.01); *H01L 31/0324* (2013.01)

(58) Field of Classification Search
CPC ... G01T 1/24; G01T 1/241; H01L 31/022408; H01L 31/0324
See application file for complete search history.

(56) References Cited

U.S. PATENT DOCUMENTS

| 6,169,287 B1 | 1/2001 | Warburton |
| 2010/0252744 A1 | 10/2010 | Herrmann et al. |
| 2011/0210235 A1 | 9/2011 | Dierickx |
| 2014/0209809 A1 | 7/2014 | Zhang et al. |

FOREIGN PATENT DOCUMENTS

| EP | 2 876 465 A1 | 5/2015 |
| WO | WO 2016/096622 A1 | 6/2016 |

OTHER PUBLICATIONS

Extended European Search Report as issued in European Patent Application No. 17173779.4, dated Nov. 9, 2017.
Communication pursuant to Article 94(3) EPC as issued in European Patent Application No. 17173779.4, dated Dec. 21, 2018.

*Primary Examiner* — Mark R Gaworecki
(74) *Attorney, Agent, or Firm* — Pillsbury Winthrop Shaw Pittman LLP

(57) ABSTRACT

A semiconductor may include a semiconductor detection material including a first side and a second side opposite to each other, a cathode disposed on the first side, and an anode disposed on the second side. The anode includes an array of pixel anodes defining detection pixels of the semiconductor detector, and intermediate anodes disposed between adjacent ones of the pixel anodes. According to an embodiment of the present disclosure, it is possible to achieve signal correction to improve the energy resolution and the signal-to-noise ratio of the detector.

20 Claims, 3 Drawing Sheets

SEMICONDUCTOR DETECTOR

This application claims priority to Chinese Patent Application No. 201610798761.5, filed Aug. 31, 2016, which is incorporated herein in its entirety by reference.

TECHNICAL FIELD

The present disclosure relates to semiconductor detectors for radiation detection, and more particularly to an electrode design of a pixel anode of a detector for radiation detection and imaging.

BACKGROUND

Semiconductor detectors, due to their higher detection efficiency and better energy resolution, are widely considered, and applied to various applications of radiation detection, for example, nuclide identification devices, metering alarm devices, etc. in environmental radiation detection; item detection devices, such as item inspection machines and industrial computer tomography (CT), in national security; CT, dental imaging, positron emission tomography (PET), single photon emission computer tomography (SPECT) in medical applications. There are many types of semiconductor materials, such as CdMnTe (cadmium manganese telluride), $HgI_2$ (mercury iodide), TlBr (thallium bromide), $PbI_2$ (lead iodide), GaAs (gallium arsenide), Ge (germanium), and so on, which are applied to different areas due to their different characteristics.

CdZnTe (cadmium zinc telluride, abbreviated to CZT), in addition to its good energy resolution and high detection efficiency, can work at room temperature, which enables it to be a most promising material for radiation detection. With the CZT semiconductor, detectors designed in a pixel-based structure can be applied in a number of areas of radiation imaging, such as dental CT, SPECT and so on.

SUMMARY

The pixel-based structure can obtain not only a good energy resolution but also a relatively high spatial resolution, and thus can have a wide application in astronomical imaging, medical imaging, and other aspects.

A pixel electrode (pixel cathode or pixel anode) is a unipolar charge sensitive technique, with induced charges contributed by drifting of only one type of carrier. Unlike a uniform field in a planar detector, a pixel-based detector has a non-uniform electric field distribution therein. A generated free charge, when drifting in a region distant to pixel electrodes, induces very small charge on a single pixel electrode, because the free charge is shared by a plurality of pixel electrodes. Only when the free charge drifts near the pixel electrode, the induced charge on the corresponding pixel electrode will change rapidly. The induced charge on the single pixel electrode is almost entirely contributed by drifting of the charge in the vicinity of the pixel electrode. In a CZT detector with pixel anodes, the induced charges on the pixel anodes contributed by hole drifting are almost negligible, thus realizing a unipolar charge sensitive technique and improving energy spectrum resolution.

However, free charges will diffuse during drifting, and some of the charges will be collected by adjacent pixels, resulting in charge distribution problems. With a decrease in pixel size, the problem of charge distribution becomes more severe, making the energy spectrum resolution of one single pixel worse. For example, when a position at which a photon is incident is in the middle of two adjacent pixels, then charges induced by the incident photon will be collected by those two adjacent pixels, resulting in false signals in each of those two pixels. As a further example, when a position at which a photon is incident is in the middle of four adjacent pixels, then charges induced by the incident photon will be collected by those four adjacent pixels. In actual situations, the position of the incident photon is uncertain, and a signal component contributed by respective pixels is also uncertain, so it is difficult to accurately locate the incident position of a ray.

Charge sharing may be corrected through signal compliance, but workload in circuit design is very large, and the efficiency of signal correction will not be very high. It may be impossible to achieve real-time signal acquisition and analysis by data collection and then data processing.

In view of one or more of the above problems or other problems in the art now or in the future, the present disclosure aims to provide, among others, a semiconductor detector having an improved anode structure.

According to an aspect of the present disclosure, there is provided a semiconductor detector, comprising: a semiconductor detection material comprising a first side and a second side opposite to each other; a cathode disposed on the first side; and an anode disposed on the second side, wherein the anode comprises an array of pixel anodes defining detection pixels of the semiconductor detector and intermediate anodes disposed between adjacent ones of the pixel anodes.

The semiconductor detector according to the present disclosure may further comprise central anodes disposed between adjacent ones of the intermediate anodes.

The semiconductor detector according to the present disclosure may further comprise a signal processing circuit configured to determine a detection signal for each pixel anode of the pixel anode array based on a signal collected on the pixel anode and a signal collected on the intermediate anode(s) and/or the central anode(s) adjacent to the pixel anode. For example, the signal processing circuit may be configured to determine the detection signal based on a weighted sum. The signal processing circuit may be configured to determine the detection signal of the pixel anode to be zero when the signal collected on the intermediate anode(s) and/or the central anode(s) adjacent to the pixel anode has an amplitude greater than that of the signal collected on the pixel anode.

The pixel anode array may be in a variety of suitable forms, such as a one-dimensional linear array, a two-dimensional planar array or a trapezoidal structure of the pixel anodes.

The pixel anode may be in various suitable shapes, such as a square, rectangular, circular, or elliptical shape.

The intermediate anode may be in various suitable shapes, such as a rectangular, elliptical, curved, or rhombic shape.

The central anode may be in various suitable shapes, such as a square, circular, elliptical, rectangular, or rhombic shape.

The semiconductor detection material may include various suitable radiation detection materials, including, for example, CdZnTe, Ge, CdTe, $HgI_2$, $PbI_2$, TlBr, or GaAs.

The pixel anodes, the intermediate anodes, and the central anodes each may comprise various suitable electrode materials, including, for example, at least one selected from: gold, platinum, nickel, titanium, or indium.

The cathode can be of various suitable layouts, such as a planar type, a pixel type, or a stripe type.

According to embodiments of the present disclosure, the intermediate anodes and/or the central anodes may be incorporated into the anode pixel array. It is possible to improve the energy resolution and signal-to-noise ratio of the detector by collecting signals on the anode pixels and also the intermediate anodes and/or the central anodes and applying a signal correction (e.g., the above weighted sum).

BRIEF DESCRIPTION OF THE DRAWINGS

The foregoing and other objects, features and advantages of the present disclosure will become more apparent from the following description of embodiments of the present disclosure with reference to the accompanying drawings, in which.

DETAILED DESCRIPTION

Figure 1:
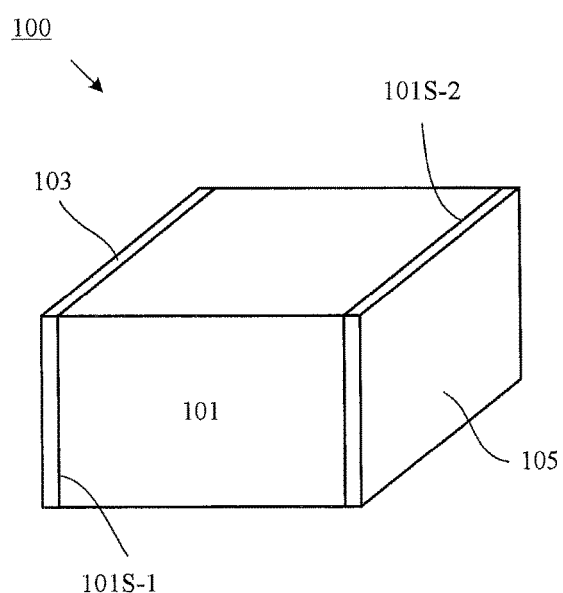
FIG. 1 is a perspective view showing a semiconductor detector according to an embodiment of the present disclosure.

Hereinafter, embodiments of the present disclosure are described with reference to the attached drawings. However, it is to be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, or relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

FIG. 1 is a perspective view showing a semiconductor detector according to an embodiment of the present disclosure.

As shown in FIG. 1, the semiconductor detector 100 according to this embodiment may include a semiconductor detection material 101. Here, the semiconductor detection material 101 is capable of interacting with radiation to enable detection of the radiation and thus generating electric charges. For example, the semiconductor detection material 101 may include CdZnTe, Ge, CdTe, HgI$_2$, PbI$_2$, TlBr or GaAs. In the following description, CdZnTe (CZT) is described as an example, but the present disclosure is not limited thereto. The semiconductor detection material 101 may be a crystalline material, so that at least some of its surfaces can be obtained, for example, by cleavage. In this example, the semiconductor detection material 101 is shown as a hexahedron (more specifically, a rectangular solid) having a size of about 10 mm×10 mm×5 mm. However, the present disclosure is not limited thereto.

The semiconductor detection material 101 may include opposite sides 101S-1 and 101S-2, on which a cathode 103 and an anode 105 may be formed, respectively. An electric field may be formed between the cathode 103 and the anode 105 to direct the charges induced by the radiation in the semiconductor detection material 101 in order to detect the radiation. For example, the radiation may be incident on the semiconductor detection material 101 via the cathode 103, interacting with the semiconductor detection material 101, and thus generating the electric charges (e.g., electrons). The charges may be collected by the anode 105 and thereby a detection signal may be obtained as a result of the detection by the detector.

Certainly, the present disclosure is not limited thereto. For example, the radiation may also be incident via the anode 105. In this case, the following descriptions regarding the cathode and the anode can be interchanged.

The cathode 103 and the anode 105 may each include, for example, a conductive material, for example, a metal material such as gold, platinum, nickel, titanium, or indium, or a mixture selected therefrom, or a laminate selected therefrom. The cathode 103 and the anode 105 may be formed by, for example, vaporizing the conductive material onto the sides 101S-1 and 101S-2 of the semiconductor detection material 101, respectively, and performing lithography on the vapor-deposited conductive material. It is to be noted that the cathode 103 and the anode 105 may include the same material or different materials.

The cathode 103 and the anode 105 may be formed in various forms. For example, the cathode 103 may be formed as a planar type (for example, a planar electrode covering at least a part of the side 101S-1), a pixel type (for example, electrodes in a pixel array form formed on the side 101S-1) or a strip type (for example, electrodes in a strip form formed on the side 101S-1). According to an embodiment of the present disclosure, the anode 105 may be formed in the form of a pixel type, i.e., a pixel array, as will be described in further detail below.

Figure 2:
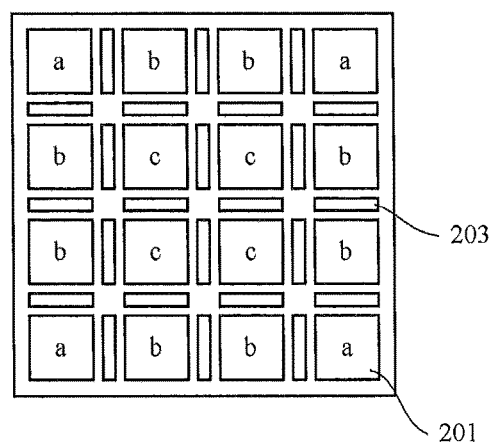
FIG. 2 is a plan view showing an anode configuration according to an embodiment of the present disclosure.

FIG. 2 is a plan view showing an anode configuration according to an embodiment of the present disclosure.

As shown in FIG. 2, the anode 200 according to this embodiment may include a two-dimensional array of pixel anodes 201. These pixel anodes 201 define detection pixels of the semiconductor detector. Here, the term "detection pixel" means that the detector performs imaging of detected radiation based on the detection result of these pixels, that is, a detection pixel corresponds to a pixel in an image of the radiation. In FIG. 2, a 4×4 array is shown, but the present disclosure is not limited thereto. The present disclosure may include larger or smaller arrays, and the number of pixels in a row needs not to be equal to the number of pixels in a column in the array.

In addition, in this example, the pixel anode 201 is shown as a square, but the present disclosure is not limited thereto. For example, the pixel anode 201 may be formed in another shape, such as a rectangle, a circle, an ellipse, or the like, as needed.

As described in the Summary section, the array of pixel anodes 201 can have a charge distribution problem. To this end, the anode 200 according to this embodiment further includes intermediate anodes 203 disposed between adjacent ones of the pixel anodes 201. In this example, the intermediate anode 203 is formed in a rectangular shape corresponding to the gap between the adjacent pixel anodes 201. However, the present disclosure is not limited thereto. For example, the intermediate anode 203 may be formed in an elliptical, curved or rhombic shape. Desirably, the shape of the intermediate anode 203 may be adapted to that of the gap between the adjacent pixel anodes 201.

The pixel anode 201 and the intermediate anode 203 may be formed by patterning (by means of, e.g., photolithography) the same layer of conductive material, so that they may include the same conductive material, such as the metal material described above.

The intermediate anode 203 may have a bias voltage applied thereto to collect charges induced by the radiation during detection, however, a signal collected thereby is mainly used to correct a signal collected by the pixel anode 201, without constituting a pixel of the final detection result. That is, for a semiconductor detector having an anode configuration as shown in FIG. 2, the detection result is a 4×4 array of detection signals corresponding to the array of pixel anodes 201.

For the bias voltage setting of the pixel anode 201 and the intermediate electrode 203 during detection, it may be determined, for example, by a calibration process. For example, the detector may be irradiated with reference radiation. The setting of the bias voltage may be such that: for reference radiation irradiating a region corresponding to a certain pixel anode 201, a signal collected by this pixel anode 201 has an amplitude greater than that of a signal collected by an intermediate anode 203 adjacent thereto; while for reference radiation irradiating a region corresponding to a certain intermediate anode 203, a signal collected by this intermediate anode 203 has an amplitude greater than that of a signal collected by a pixel anode 201 adjacent thereto.

According to an embodiment of the present disclosure, a signal processing circuit may be provided for processing the signals collected by the anode 200 to obtain a final detection signal or detection result. Such a signal processing circuit may be included in the semiconductor detector, or may be provided separately from the semiconductor detector.

According to an embodiment of the present disclosure, for a certain pixel anode 201, if one or more of intermediate anodes 203 adjacent thereto collect a signal with an amplitude greater than that of a signal collected by this pixel electrode 201 (implying that an incident ray is at a position between some pixel anodes), the signal processing circuit may determine the detection signal of the pixel electrode 201 to be zero (0), although the pixel electrode 201 may collect a non-zero signal. This can be implemented, for example, simply by a comparator.

Further, the signal processing circuit may also correct the detection signal of the pixel anode 201. Specifically, for each pixel anode 201, the detection signal of the pixel anode 201 may be determined based on the signal collected on the pixel anode 201 and also the signal(s) collected on the intermediate anode(s) 203 adjacent to the pixel anode 201. This correction can be done, for example, by a weighted sum. A weighting factor(s) can be determined by a calibration process. For example, reference radiation with different amplitudes may irradiate the position corresponding to a certain pixel anode 201, and accordingly signals may be collected on the pixel anode 201 and the intermediate anode(s) 203 adjacent thereto. The weighting factor(s) can be determined based on the amplitude of the reference radiation and the collected signals corresponding thereto. For simplification, the weighting factor can be 1. This can be implemented, for example, simply by an adder.

Figure 5:
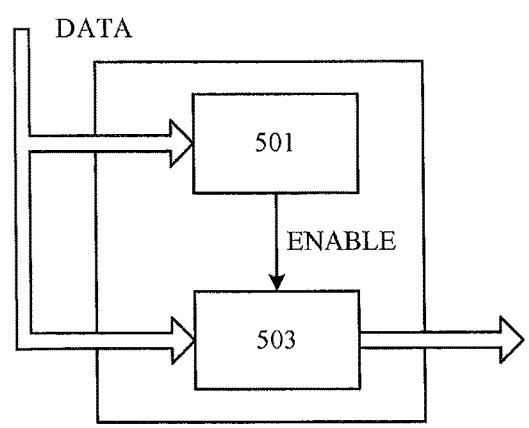
FIG. 5 is a block view showing a signal processing circuit according to an embodiment of the present disclosure.

The signal processing circuit with the comparison and weighted sum functionalities can be implemented in various ways. For example, it can be implemented through a combinational logic circuit. Reference may be made to FIG. 5, where an example of the signal processing circuit is shown. As shown in FIG. 5, the signal processing circuit 500 may include a comparator 501 and an adder 503. In particular, the signals (indicated as "DATA" in FIG. 5) collected by the pixel anode 201 and the intermediate anode(s) 203 adjacent thereto may be inputted to the comparator 501 and the adder 503, respectively. In the comparator 501, the signals collected by the pixel anode 201 and the intermediate anode(s) 203 can be compared. When the signal collected by the pixel anode 201 is greater than the signal collected by the intermediate anode(s) 203, an output (indicated as "ENABLE" in FIG. 5) from the comparator 501 may enable the adder 503 so that the adder 503 can add the input signals. In the adder 503, the weighting factor(s) can be preset. In addition, when the signal collected by the pixel anode 201 is smaller than the signal collected by the intermediate anode(s) 203, the comparator output may reset the adder 503 so that the adder output is zero.

Hereinafter, the signal correction processing will be described in more detail in connection with the example of FIG. 2.

In the example of, and as depicted on, FIG. 2, the pixel anodes 201 can be divided into three categories as follows according to the number of adjacent pixel anodes or according to the number of adjacent intermediate anodes: those each having two pixel anodes or two intermediate anodes adjacent thereto (class a), those each having three pixel anodes or three intermediate anodes adjacent thereto (class b), and those each having four pixel anodes or four intermediate anodes adjacent thereto (class c).

The amplitudes of the signals collected by the pixel anodes 201 are defined as $V_a$, $V_b$, $V_c$, wherein subscripts a, b, and c represent the signals of pixel anodes of classes a, b and c, respectively. Further, the amplitudes of the signals collected by the intermediate anodes 201 are defined as $V_1$, $V_2$, $V_3$, $V_4$, wherein subscripts 1, 2, 3, and 4 represent the $1^{st}$, $2^{nd}$, $3^{rd}$ and $4^{th}$ intermediate anode adjacent to the pixel anode, respectively.

For a pixel anode of class a, a corrected signal value V can be expressed as:

$$V=V_a+k_1V_1+k_2V_2$$

Similarly, for a pixel anode of class b, a corrected signal value V can be expressed as:

$$V=V_b+k_1V_1+k_2V_2+k_3V_3$$

Similarly, for a pixel anode of class c, a corrected signal value V can be expressed as:

$$V=V_c+k_1V_1+k_2V_2+k_3V_3+k_4V_4$$

Here, values of coefficients $k_1$, $k_2$, $k_3$, $k_4$ vary depending on actual detector performances, and each can be 1 for simplification.

After the data is corrected, the pixel anode of the detector will have an improved energy resolution and an improved signal-to-noise ratio, and thus the detector will have improved imaging quality.

Figure 3:
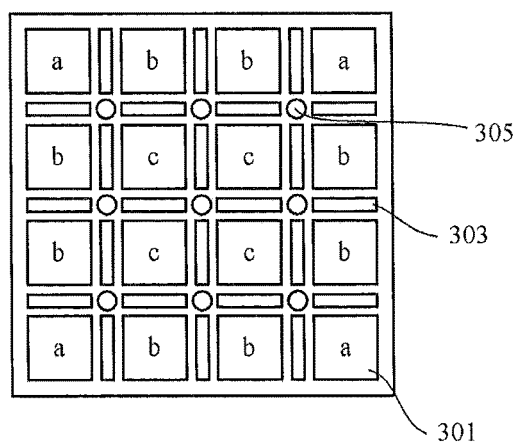
FIG. 3 is a plan view showing an anode configuration according to a further embodiment of the present disclosure.

FIG. 3 is a plan view showing an anode configuration according to a further embodiment of the present disclosure.

As shown in FIG. 3, similar to the anode 200 shown in FIG. 2, the anode 300 according to this embodiment may include a two-dimensional array of pixel anodes 301 and intermediate anodes 303 disposed between adjacent ones of the pixel anodes 301. With respect to the pixel anode 301 and the intermediate anode 303, reference may be made to the above descriptions of FIG. 2, and detailed descriptions thereof will be omitted here.

In order to further improve the charge distribution problem, the anode 300 according to this embodiment may further include central anodes 305 disposed between adjacent ones of the intermediate anodes. Specifically, a central anode 305 is provided in the gap between adjacent intermediate anodes 303 so that the central anode 305 may be surrounded by the intermediate anodes 303. In this example, the central anode 305 may be formed in a circular shape, but the present disclosure is not limited thereto. For example, the central anode 305 may be formed in other shapes, such as a square, circular, elliptical, rectangular, or rhombic shape. Desirably, the shape of the central anode 305 may be adapted to the shape of the gap between the adjacent intermediate anodes 303.

The pixel anode 301, the intermediate anode 303, and the central anode 305 may be formed by patterning (by means of, e.g., photolithography) the same layer of conductive material, so that they may include the same conductive material, such as the metal material described above.

The bias voltage setting for the pixel anode 301, the intermediate anode 303, and the central anode 305 may be determined, for example, by the calibration process as described above.

Here, the intermediate anode 303 and the central anode 305 function similarly, and are mainly used to correct a signal collected by the pixel anode 301, without constituting a pixel of the final detection result. This signal correction is similar to the signal correction described above in connection with FIG. 2. During the correction, the signal collected by the intermediate anode 303 and the signal collected by the central anode 305 can be considered in the same manner. This can be achieved, for example, by the above-mentioned signal processing circuit, except that the signal collected by the central anode 305 is taken into account in addition to the signal collected by the intermediate anode 303.

For example, for a pixel anode 301, if one or more of intermediate anodes 303 and/or central anodes 305 adjacent thereto collect a signal, with an amplitude greater than that of a signal collected by the pixel electrode 301, the signal processing circuit may determine the detection signal of the pixel electrode 301 to be zero (0). This can be implemented, for example, simply by a comparator.

For a further example, for each pixel anode 301, the detection signal of the pixel anode 301 may be determined (e.g., by a weighted sum) based on the signal collected on the pixel anode 301 and the signals collected on the intermediate anode(s) 303 and the central anode(s) 305 adjacent to the pixel anode 301.

Hereinafter, the signal correction processing will be described in more detail in connection with the example of FIG. 3. Similar to the above embodiment, in this example, the pixel anodes 301 may likewise be divided into three categories (a, b, c).

The amplitudes of the signals collected by the pixel anodes 301 are defined as $V_a$, $V_b$, and $V_c$, wherein subscripts a, b, and c represent the signals of pixel anodes of classes a, b, and c, respectively. The amplitudes of the signals collected by the intermediate anodes 201 are defined as $V_1$, $V_2$, $V_3$, $V_4$, wherein subscripts 1, 2, 3, and 4 represent the $1^{st}$, $2^{nd}$, $3^{rd}$, and $4^{th}$ intermediate anode adjacent to the pixel anode, respectively. Further, the amplitudes of the signals collected by the central anodes 305 are defined as $C_1$, $C_2$, $C_3$, and $C_4$, wherein subscripts 1, 2, 3, and 4 represent the $1^{st}$, $2^{nd}$, $3^{rd}$, and $4^{th}$ central anode adjacent to the pixel anode, respectively.

For a pixel anode of class a, a corrected signal value V can be expressed as:

$$V = V_a + k_1 V_1 + k_2 V_2 + m_1 C_1$$

Similarly, for a pixel anode of class b, a corrected signal value V can be expressed as:

$$V = V_b + k_1 V_1 + k_2 V_2 + k_3 V_3 + m_1 C_1 + m_2 C_2$$

Similarly, for a pixel anode of class c, a corrected signal value V can be expressed as:

$$V = V_c + k_1 V_1 + k_2 V_2 + k_3 V_3 + k_4 V_4 + m_1 C_1 + m_2 C_2 + m_3 C_3 + m_4 C_4$$

Here, values of coefficients $k_1$, $k_2$, $k_3$, $k_4$, $m_1$, $m_2$, $m_3$, and $m_4$ vary depending on actual detector performances, and each can be 1 for simplification.

In the above embodiment, the array of pixel anodes is shown as a two-dimensional planar array, but the present disclosure is not limited thereto. For example, the array of pixel anodes may be other layouts such as a one-dimensional linear array or a trapezoidal structure and so on.

Figure 4:
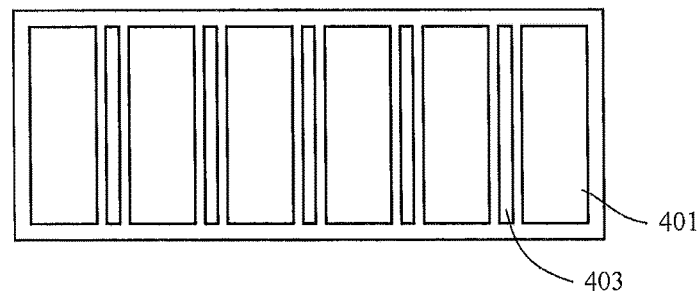
FIG. 4 is a plan view showing an anode configuration according to a further embodiment of the present disclosure.

FIG. 4 is a plan view showing an anode configuration according to a further embodiment of the present disclosure.

As shown in FIG. 4, the anode 400 according to this embodiment may include a one-dimensional linear array of pixel anodes 401. These pixel anodes 401 define detection pixels of the semiconductor detector. Likewise, in order to cope with the charge distribution problem, the anode 400 may also include intermediate anodes 403 disposed between adjacent ones of the pixel anodes 401. In this example, the intermediate anode 403 is formed in an elongate shape corresponding to the gap between the adjacent pixel anodes 401.

The pixel anode 401 and the intermediate anode 403 may be formed by patterning (by means of, e.g., photolithography) the same layer of conductive material, so that they may include the same conductive material, such as the metal material described above.

The bias voltage setting for the pixel anode 401 and the intermediate anode 403 may be determined, for example, by the calibration process as described above.

Here, the intermediate anode 403 is mainly used to correct a signal collected by the pixel anode 401, without constituting a pixel of the final detection result. This signal correction is done as described above in connection with FIG. 2.

For example, the pixel anode 401 may be divided into two categories: edge anodes each having only one pixel anode or one intermediate anode adjacent thereto (class a); and those each having two pixel anodes or two intermediate anodes adjacent thereto (class b).

The amplitudes of the signals collected by the pixel anodes 401 are defined as $V_a$ and $V_b$, wherein subscripts a and b represent the signals of pixel anodes of classes a and b, respectively. Further, the amplitudes of the signals collected by the intermediate anodes 403 are defined as $V_1$ and $V_2$, wherein subscripts 1 and 2 represent the $1^{st}$ and $2^{nd}$ intermediate anodes adjacent to the pixel anode, respectively.

For a pixel anode of class a, a corrected signal value V can be expressed as:

$$V = V_a + k_1 V_1$$

Similarly, for a pixel anode of class b, a corrected signal value V can be expressed as:

$$V = V_b + k_1 V_1 + k_2 V_2$$

Here, values of coefficients $k_1$ and $k_2$ vary depending on actual detector performance, and each can be 1 in for simplification.

The embodiments of the present disclosure have been described above. However, these embodiments are only for illustrative purposes, and are not intended to limit the scope of the present disclosure. The scope of the present disclosure is defined by the appended claims and their equivalents. It will be apparent for those skilled in the art to make various alternatives and modifications without departing from the scope of the present disclosure, and such alternatives and modifications should be within the scope of the present disclosure.

What is claimed is:

1. A semiconductor detector, comprising:
a semiconductor detection material comprising a first side and a second side opposite to each other;
a cathode disposed on the first side; and
an anode disposed on the second side,
wherein the anode comprises an array of pixel anodes defining detection pixels of the semiconductor detector and intermediate anodes disposed between adjacent ones of the pixel anodes, and
wherein the intermediate anodes are configured to correct a signal collected by the pixel anodes, without constituting a pixel of a final detection result.

2. The detector of claim 1, further comprising a central anode disposed between adjacent ones of the intermediate anodes.

3. The detector of claim 2, wherein the central anode has a square, circular, elliptical, rectangular, or rhombic shape.

4. The detector of claim 2, wherein the central anode comprises at least one selected from: gold, platinum, nickel, titanium, or indium.

5. The detector of claim 2, further comprising a signal processing circuit configured to determine a detection signal for each pixel anode of the pixel anode array based on a signal collected on the pixel anode and a signal collected on the central anode(s) and/or the intermediate anode(s) adjacent to the pixel anode.

6. The detector of claim 5, wherein the signal processing circuit is configured to determine the detection signal based on a weighted sum.

7. The detector of claim 5, wherein the signal processing circuit is configured to determine the detection signal of the pixel anode to be zero when the signal collected on the central anode(s) and/or the intermediate node(s) adjacent to the pixel anode has an amplitude greater than that of the signal collected on the pixel anode.

8. The detector of claim 1, further comprising a signal processing circuit configured to determine a detection signal for each pixel anode of the pixel anode array based on a signal collected on the pixel anode and a signal collected on the intermediate anode(s) adjacent to the pixel anode.

9. The detector of claim 8, wherein the signal processing circuit is configured to determine the detection signal based on a weighted sum.

10. The detector of claim 8, wherein the signal processing circuit is configured to determine the detection signal of the pixel anode to be zero when the signal collected on the intermediate anode(s) adjacent to the pixel anode has an amplitude greater than that of the signal collected on the pixel anode.

11. The detector of claim 1, wherein the pixel anode array comprises a one-dimensional linear array, a two-dimensional planar array or a trapezoidal structure of the pixel anodes.

12. The detector of claim 1, wherein the pixel anodes each have a square, rectangular, circular, or elliptical shape.

13. The detector of claim 1, wherein the intermediate anodes each have a rectangular, elliptical, curved, or rhombic shape.

14. The detector of claim 1, wherein the semiconductor detection material comprises CdZnTe, Ge, CdTe, $HgI_2$, $PbI_2$, TlBr, or GaAs.

15. The detector of claim 1, wherein the pixel anodes and/or the intermediate anodes each comprise at least one selected from: gold, platinum, nickel, titanium, or indium.

16. The detector of claim 1, wherein the cathode is of a planar type, a pixel type, or a stripe type.

17. A detection method comprising:
providing radiation on a semiconductor detector, the semiconductor detector, comprising:
a semiconductor detection material comprising a first side and a second side opposite to each other,
a cathode disposed on the first side, and
an anode disposed on the second side,
wherein the anode comprises an array of pixel anodes defining detection pixels of the semiconductor detector and intermediate anodes disposed between adjacent ones of the pixel anodes, and
wherein the intermediate anodes are configured to correct a signal collected by the pixel anodes, without constituting a pixel of a final detection result; and
obtaining a measurement of the radiation using the anode of the semiconductor detector.

18. The method of claim 17, further comprising determining a detection signal for each pixel anode of the pixel anode array based on a signal collected on the pixel anode and a signal collected on the intermediate anode(s) adjacent to the pixel anode.

19. The method of claim 18, further comprising determining the detection signal based on a weighted sum.

20. The method of claim 18, further comprising determining the detection signal of the pixel anode to be zero when the signal collected on the intermediate anode(s) adjacent to the pixel anode has an amplitude greater than that of the signal collected on the pixel anode.

* * * * *